United States Patent [19]
Heath

[11] Patent Number: 5,802,184
[45] Date of Patent: Sep. 1, 1998

[54] ACTIVE NOISE AND VIBRATION CONTROL SYSTEM

[75] Inventor: Michael C. Heath, Cary, N.C.

[73] Assignee: Lord Corporation, Cary, N.C.

[21] Appl. No.: 698,544

[22] Filed: Aug. 15, 1996

[51] Int. Cl.⁶ .................................................. A61F 11/06
[52] U.S. Cl. .......................... 381/71.4; 381/86; 381/71.1
[58] Field of Search ............................. 381/71, 94, 86, 381/73.1, 120, 96, 71.1, 71.2, 71.8, 71.13, 94.1, 71.11; 330/10

[56] References Cited

U.S. PATENT DOCUMENTS

| | | | |
|---|---|---|---|
| 4,346,349 | 8/1982 | Yokoyama | 330/10 |
| 4,562,589 | 12/1985 | Warnaka et al. | |
| 4,808,863 | 2/1989 | Andersson | |
| 4,947,356 | 8/1990 | Elliott et al. | |
| 5,131,047 | 7/1992 | Hashimoto et al. | 381/71.1 |
| 5,310,137 | 5/1994 | Yoerkie, Jr. et al. | |
| 5,323,133 | 6/1994 | Heath et al. | |
| 5,386,689 | 2/1995 | Bozich et al. | |
| 5,410,607 | 4/1995 | Mason et al. | |
| 5,427,347 | 6/1995 | Swanson et al. | |
| 5,453,943 | 9/1995 | Magliozzi | |
| 5,487,027 | 1/1996 | Heath et al. | |
| 5,523,715 | 6/1996 | Schrader | 381/96 |
| 5,526,292 | 6/1996 | Hodgson et al. | |
| 5,568,557 | 10/1996 | Ross et al. | 381/86 |
| 5,574,405 | 11/1996 | Razavi | 331/2 |

FOREIGN PATENT DOCUMENTS

WO96/12121  4/1996  WIPO .

OTHER PUBLICATIONS

Swanson, D.A. and Miller, L.R., *Design and Effectiveness Evaluation of an Active Vibration Isolation System for a Commercial Jet Aircraft*, Lord Library of Technical Articles LL–6003 (1994).

Harris Application Note 9404, No. 5174, p. 3, Apr. 1994.

*Primary Examiner*—Vivian Chang
*Attorney, Agent, or Firm*—Myers Bigel Sibley & Sajovec, P.A.

[57] ABSTRACT

Vibrational energy in a first frequency range within a vehicle or the like is controlled by an active vibration control system which includes a sensor, controller, driver, actuator and actuator power dissipation reduction circuit. The controller provides a control signal to a Class-D power amplifier operating at a second higher frequency to generate an output signal to the actuator in the frequency range of the noise/vibration to be controlled resulting in a force output from the actuator controlling vibration and/or noise in a passenger compartment of the vehicle. The actuator power dissipation reduction circuit reduces high frequency energy transients with in-series inductors to prevent heat inducing eddy currents in the actuator without additional current flow in the power amplifier.

7 Claims, 9 Drawing Sheets

Fig. 14

ACTIVE NOISE AND VIBRATION CONTROL SYSTEM

FIELD OF THE INVENTION

This invention relates to active noise and vibration control, and, more particularly, to an apparatus for the control of noise within a closed body of a vehicle.

BACKGROUND OF THE INVENTION

The attenuation in a closed structure or body of a vehicle of noise created by a source disposed either externally or in the interior of the vehicle may be accomplished by either passive or active means. As used herein, the term "closed structure" refers generally to an enclosure having an interior bounded by substantially continuous walls, such as, for example, an airplane fuselage. The control may be directed to noise control, vibration control or both noise and vibration control.

Passive attenuation of noise in such applications may be accomplished by disposing barrier materials in the area where the reduced noise level is desired. However, in moving vehicles, such as aircraft fuselages, which will be discussed herein to illustrate the advantages of the present invention, passive means of noise attenuation create as well as solve problems. Barrier materials must be relatively dense to be effective in reflecting incident sound waves. The higher the density of a material the more it weighs. It is apparent that the addition of weight to the fuselage of an aircraft to enhance noise attenuation has the adverse effect of reducing fuel economy, payload and flight range. In addition, most acoustically absorbent or dampening materials are relatively easily damaged and make poor surfaces for use in the interior of aircraft.

In the realm of active noise and vibration control, there are various implementation approaches including: active noise control, which uses an inverse phase sound wave to cancel the disturbing signal; active structural control, which vibrates a structural component at a frequency to cancel the input disturbance (noise and/or vibration); and active isolation control, where an actuator in a mount is reciprocated at the proper frequency, phase and amplitude to cancel the input disturbance (which, again, may be a structural vibration or in the audible range, in which case it is experienced as noise).

Active vibration and sound control systems generally utilize computer processors to control or minimize mechanical vibration or ambient noise levels at a defined location or locations. Generally, these active systems are responsive to at least one external input signal such as a feed forward reference signal and/or error signal as supplied by various types of sensors such as microphones, accelerometers, tachometers etc. Generally these systems strive to reduce to zero or at least minimize the recurring sound and/or vibration. Examples of such systems are taught in U.S. Pat. Nos. 4,677,676 to Eriksson, 4,153,815 to Chaplin et al., 4,122,303 to Chaplin et al., 4,417,098 to Chaplin et al., 4,232,381 to Renick et al., 4,083,433 to Geohegan, Jr. et al., 4,878,188 to Ziegler, Jr., 4,562,589 to Warnaka et al., 4,473,906 to Warnaka et al., 5,170,433 to Elliott, 4,689,821 to Salikuddin et al., 5,174,552 to Hodgson and 5,133,527 to Chen et al., the disclosures of each of which are hereby incorporated by reference herein as if set forth in their entirety.

Each of these active methods of noise and vibration control carries with it certain disadvantages in application to vehicles such as aircraft. Vehicles generally include as objectives in design a variety of aspects other than noise and vibration control such as, in the case of an aircraft, heat, weight and energy requirement objectives. The components of active noise and vibration control systems necessarily add additional weight to the vehicle. It is desirable to provide a means for driving the active control system actuators which not only minimizes energy consumption but which prevents the generation of unnecessary heat. For example, in the case of an aircraft, active vibration and/or noise control systems may generate sufficient heat that it is not possible to operate them at all times, such as during landings and takeoffs.

SUMMARY OF THE INVENTION

It is, therefore, an object of the present invention to provide an improved system for controlling vibrational energy within a first frequency range within a vehicle or the like from a vibrational energy source connected to the vehicle.

It is another object of the present invention to provide a control system including a power dissipation reduction means including an inductance and providing substantially all current flow to the vibration control actuator to reduce energy loss and heat generation in an active vibration and/or noise control system.

It is a further object of the present invention to provide a pulse-width modulation control based active vibration and/or noise control system for control ling vibrational energy at a first lower frequency range with a pulse-width modulated signal operating at a higher second frequency above the frequency range of the vibrational energy to be controlled.

These and other objects are provided, according to the invention, by providing a pulse width modulated power amplifier electrically connected to an active vibration control actuator by an actuator power dissipation reduction circuit. A sensor detects the vibrational energy signal to be controlled and provides an input signal to a controller circuit which generates a control signal to the power amplifier which in turn outputs a pulse width modulation driven signal to the actuator resulting in a force being produced by the actuator to control the vibrational energy in a vehicle which is affected by the vibrational energy.

In particular, a system for controlling vibrational energy within a first frequency range within a vehicle or the like from a vibrational energy source connected to the vehicle includes a pulse width modulated amplifier operating at switching frequencies in a high frequency range such as at least 50 kHz. The output of the amplifier is passed through the actuator power dissipation reduction circuit to reduce the high frequency energy transients on the signal to reduce heat generating eddy currents from passing to the actuator.

According to one embodiment of the present invention, the amplifier is a Class-D power amplifier. The actuator is an active vibration absorber preferably having a solid iron core.

According to another aspect of an embodiment of the present invention the actuator power dissipation reduction circuit includes an inductor serially connecting between the amplifier and the actuator. The amplifier generates an alternating current output substantially all of which is provided by the amplifier to the actuator, thereby reducing the heat generation within the amplifier from current flow as well as reducing heat generating eddy currents in the actuator.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
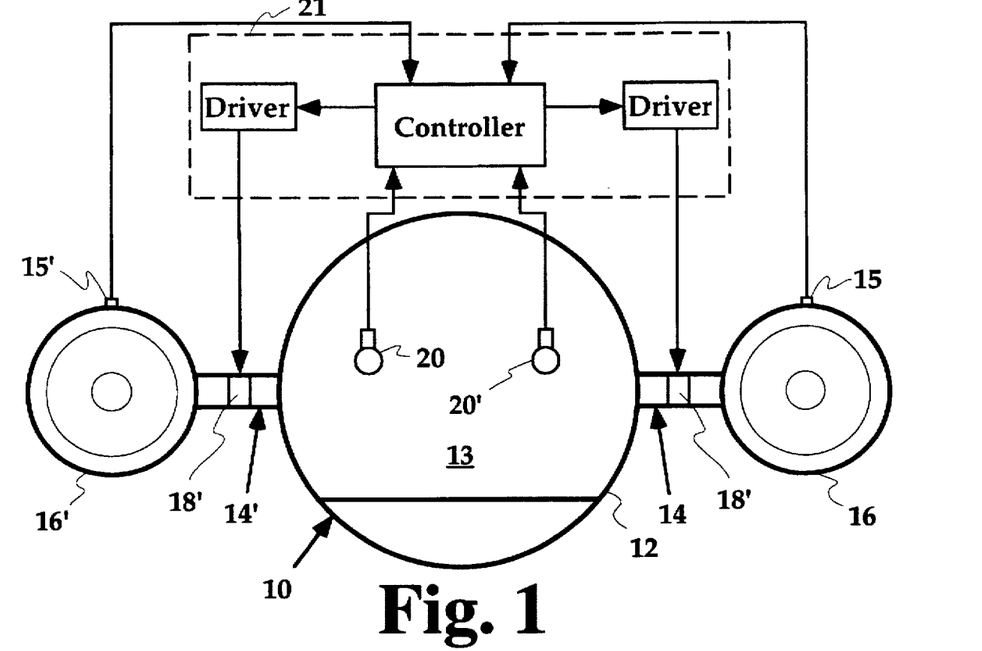
FIG. 1 is a schematic illustrating the operating environment of the present invention in an aircraft.

The environment of the present invention will first be described with reference to FIG. 1. As illustrated in FIG. 1, aircraft 10, shown in cross-section, includes fuselage 12 defining passenger compartment 13 connected by mounts 14, 14' to vibrational energy source/members (engines) 16, 16'. Active vibration control actuators 18, 18' or other actuator means for generating forces to control vibrational energy, as illustrated in FIG. 1, are mounted in mounts 14, 14', respectively. Sensors 20, 20' or other sensor means for monitoring vibrational (or noise) energy, as illustrated in FIG. 1 may be positioned within passenger compartment 13 to detect noise and/or vibration to be controlled within passenger compartment 13. Also shown are feed forward reference sensors 15, 15', or other sensor means for monitoring vibrational (or noise) energy to be controlled mounted to the casings of engines 16, 16'. Alternatively, tachometer sensors could be used.

Actuators 18, 18' and sensors 15, 15', 20, 20', are electrically connected to driver/controller 21. As illustrated in FIG. 1, vibrational energy control is provided by active isolation control where the actuator element 18, 18' is included in an isolation mount between engines 16, 16' and engine mounts 14, 14'. However, it is to be understood that the benefits of the present invention may also be obtained by active structural control. As discussed in the background section above, in an active vibrational energy control system, driver/controller 21 acts responsive to input from sensor 20 to drive actuators 18, 18' in a manner to reduce or eliminate noise and/or vibration generated by vibrational energy sources (engines) 16, 16'.

Figure 2:
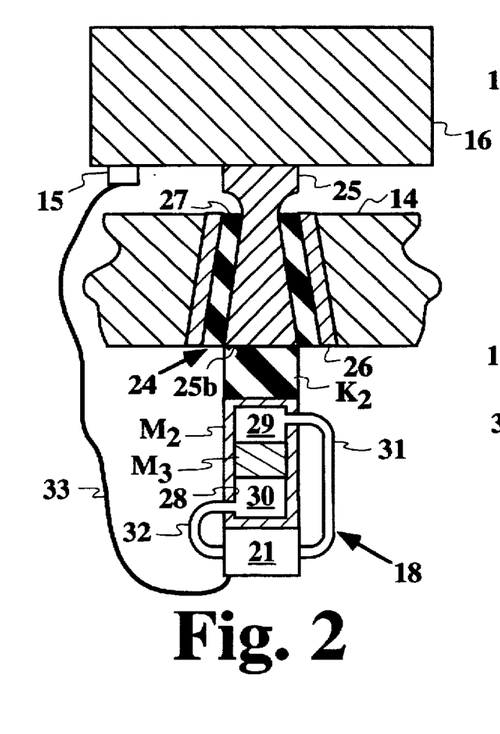
FIG. 2 is a cross-sectional side view of a schematic depiction of an embodiment of an active vibration absorber suitable for use with the present invention.

A variety of devices for providing a dynamic vibratory source at a localized point including single or multiple degrees of freedom devices may be used with the present invention as will be described with reference to FIG. 3a and FIG. 3b. A schematic depiction of a first embodiment of an active vibration control actuator, more particularly an active vibration absorber (AVA), suitable for use with the present invention is shown in FIG. 2 generally at 18. It should be noted that like numerals have been used to denote like elements. Member 16, which may, for example, be the main power plant/rotor system or transmission of a helicopter having a mass $m_1$, is attached to support structure 14, such as a helicopter fuselage, or aircraft pylon, by a passive mount 24 including an inner member 25, an outer member 26 (which is preferably a separate member), and a flexible element 27 bonded to both said inner (25) and outer (26) members. Flexible element 27 is preferably soft, having a vertical spring rate $k_1$, for example, in the range of between about 10,000 lb./in. and 50,000 lb./in. While it is preferred that the flexible element 27 be soft, it is not essential to the performance of the present invention; in fact, the vertical spring rate could be on the order of 300,000 lb./in. Softness of the flexible element 27 may enhance isolation between member 16 and support structure 14 by reducing residual vibrational forces, if any, which might be transmitted through flexible element 27 resulting in shaking of the structure 14. However, for some applications, the flexible element 27 might be omitted altogether.

An optional first spring $K_2$ having a spring rate of $k_2$ is connected to one of the inner member 25, outer member 26, and support structure 14, depicted here as connected to the base 25b of inner member 25. An active actuation means comprised of first mass $M_2$ having mass $m_2$ is bonded to the distal end of spring $K_2$. Within, or adjacent, the mass $M_2$, is a second mass $M_3$ having mass $m_3$, which can slide upwardly and downwardly, as depicted in FIG. 2, in chamber 28, or left and right, or in all four directions if appropriately mounted. Chamber 28 is subdivided into an upper chamber 29 and a lower chamber 30 by second mass $M_3$. A controller 21 includes a spool valve and controller electronics in this embodiment. The spool valve is connected to upper (29) and lower (30) chambers by tracks 31 and 32, respectively. Sensor 15 feeds a signal through cable 33 to controller 21. Sensor 15 will feed a signal indicative of the vibrational frequency of member 16 to controller 21 which will cause second mass $M_3$ to vibrate at the corresponding frequency needed to diminish, or preferably cancel, the vibration of member 16. If the oscillation of mass $M_3$ is unable to cancel out the vibration, the use of a soft element 27 can minimize vibrations transmitted to the support structure 14. However, it should be noted that it may be desired to drive a local point with the flexibly mounted AVA to cause a reduction in noise or vibration at a remote location.

Figure 3:
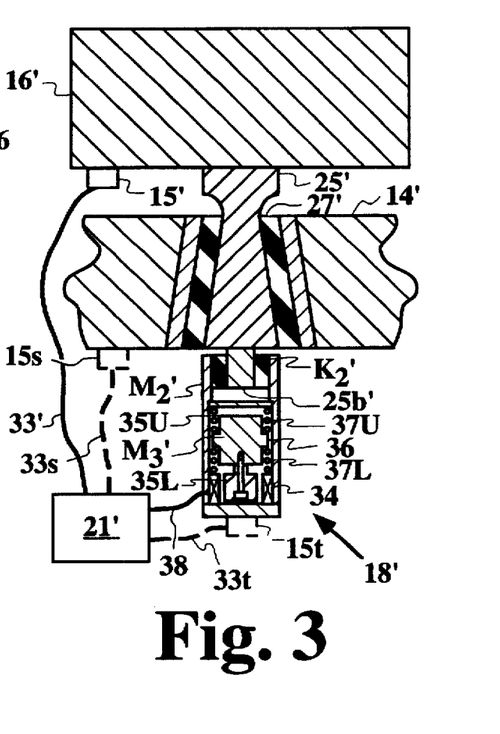
FIG. 3 is a cross-sectional side view of a schematic depiction of a second embodiment of an active vibration absorber suitable for use with the present invention.

A second embodiment of an active vibration absorber suitable for use with the present invention is depicted in FIG. 3 generally at 18'. In this embodiment, optional first spring $K_2^1$ is depicted as operating in shear rather than compression. For this purpose, the base 25$b'$ of inner member 25' is formed with a stem which is preferably bonded to and received within spring $K_2$' which is formed as an annulus. Furthermore, movable mass $M_3$' includes a magnet member. Portion 35L of the core is magnetic while portion 35U need not be. Portion 35U has a circumferential protruding flange 36 which is engaged by centering springs 37U and 37L to return the core to a neutral position when no current is flowing in coil 34. In addition to sensor 15' positioned on member 16', secondary (15$s$) and tertiary (15$t$) sensors may be positioned on support structure 14' and on active actuation means $M_2$', respectively. The signals indicative of at least one of the displacement, velocity or acceleration of these components of the system are fed to controller 21' via cables 33', 33$s$ and 33$t$, respectively. Comparison of these signals will permit the relative movements of these respective elements to be determined and for the optimal control to be effected through electrical conduit 38. Ordinarily, optimal control will involve minimizing the movement of support structure 14', but specialized circumstances may dictate an alternative control theory whereby motion of member 16' may be minimized, or sound or vibration may be minimized at a remote location.

As in the previous embodiment, active actuation means $M_2$' will be vibrated at a frequency $\omega'$, by alternating the current and thereby reversing the polarity of the magnetic field induced within coil 34, to cancel vibrational input from member 16'. In a system employing only a passive elastomeric mount, a static input force $P_i$ will produce a vibrating body having a vibrational amplitude described by the expression $X_i$ Sin $\omega t$, where $X_i$ is the maximum displacement produced by the input force $P_i$ and $\omega$ is the excitation frequency of the input. In the design phase, the natural frequency $\omega_2$ of the AVA is preferably equated to the most likely input disturbance frequency $w$ by selecting appropriately the spring constant $k_2$ of spring $K_2$ and $m_2$ of first mass $M_2$ since $\omega_2 \sqrt{(k_2/m_2)}$. Therefore, for the likely normal operation, $M_2$ will function as a tuned vibration absorber supplying a force $F_2$' which adds to the inertia force $m_1$ X to oppose $P_i$ Sin $\omega t$.

If this additive force is insufficient to counter the vibration of member 16', either because the excitation frequency is not equal to the natural frequency of the tuned mass or because the $P_i$ excitation is too large, the sensor 15' will activate oscillation of the second mass $M_3$' which will magnify the amplitude of vibration of first mass $M_2$' at the required phase, frequency and amplitude to reduce or eliminate the input vibration from member 16'. For any motions not canceled, flexible element 27' will minimize transmitted forces because of the soft spring constant $k_1$. This is true for all cases where $\omega_1$ which equals $\sqrt{(k_1/m_1)}$ is less than 70% of the excitation frequency $\omega$ (hence the desire for the soft spring).

Figure 4:
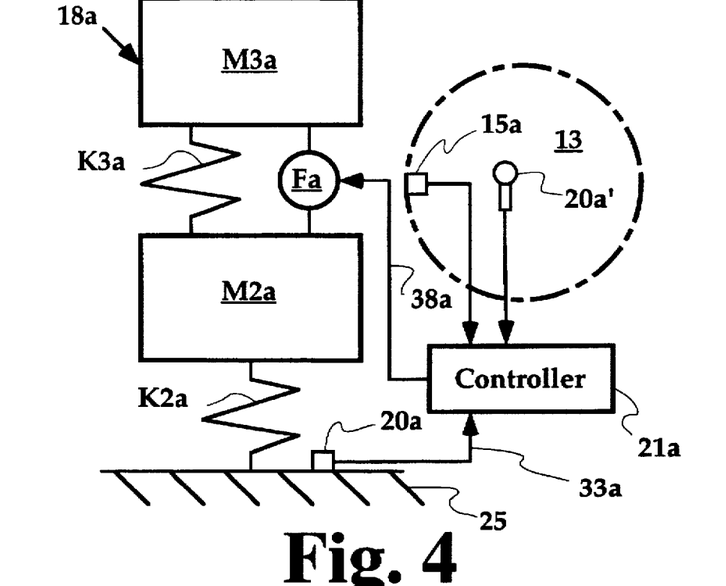
FIG. 4 is a side schematic view of a flexibly mounted active vibration absorber suitable for use with the present invention for controlling noise and/or vibration at a predefined location.

FIG. 4 illustrates an AVA 18$a$ which is flexibly mounted to member 25. The AVA 18$a$ interconnects to member 25 in an attempt to control a level of vibration and/or sound at a predefined location, such as in the remote location of closed volume 13. By the term control a level of vibration and/or sound, it is envisioned that locally, vibration may be reduced or, in some applications, may be locally increased (driven) to reduce a level of sound or vibration at a remote location. Generally, member 25 is connected structurally, in some fashion, to closed volume 13. For example, the closed volume could be an aircraft cabin and the vibrating member 25 could be the inner member of a mount vibrated by an unbalance in the aircraft engine. In this scenario, the AVA 18$a$ would attach to the inner member of a mount in the vicinity of the engine 16. Vibration of the structure, such as caused by an unbalance in the engine 16, causes unwanted noise to be generated in passenger compartment 13. The flexibly-mounted AVA 18$a$ can be driven at the structure to reduce this unwanted noise. Furthermore, it should be recognized that the vibrating member 25 could be fuselage walls 12 and the AVA 18$a$ would then be mounted directly to fuselage walls 12 or to stiffening members (ribs, stringers or frames).

The active system illustrated in FIG. 4 includes an optional first spring K2$a$ for flexibly mounting AVA 18$a$ to member 25. AVA 18$a$ is interconnected to, and freely suspended by spring K2$a$. Spring K2$a$ soft-mounts (flexibly or resiliently mounts) AVA 18$a$. Further, it should be understood that spring K2$a$ can be used to shape the output spectrum of AVA 18$a$. For instance, a level of damping, such as hysteretic or viscous, may be added to reduce the transmissibility at the resonant peaks. Moreover, the springs and masses of the system may be varied to shape the frequency response of AVA 18$a$ and to attenuate transmission of unwanted high frequency harmonics or noise caused by activation of AVA 18$a$.

AVA 18$a$ includes, in addition to an optional first free-floating mass M2$a$ attached to the first spring K2$a$, a second free-floating mass M3$a$, which is adjacent first free floating mass M2$a$, and a second spring K3$a$ interconnected between mass M2$a$ and said second mass M3$a$. An actuator Fa also interconnects first mass M2$a$ and second mass M3$a$ and is arranged in parallel relationship to second spring K3$a$ to generate active real-time positive and negative forces to oscillate, in real-time, second free-floating mass M3$a$ relative to first free-floating mass M2$a$.

Mass M2$a$ may be the case mass of AVA 18$a$ or it may be a combination of the case mass, attachment brackets and auxiliary tuning mass. It should be noted, that first free-floating mass M2$a$ and first spring K2$a$ may be tuned to provide a tuned resonant frequency which may coincide with the operating frequency of the disturbance, if desired. This makes AVA 18$a$ more effective. Furthermore, if there are multiple disturbance frequencies, such as in most aircraft applications, a system resonant frequency may be tuned to an intermediate frequency such that the power required to actuate AVA 18$a$ at both frequencies is lessened. For example, in systems having both 4 per rev and 8 per rev disturbances of substantially equal magnitude, the second resonance of the system may be tuned to be located between those two frequencies. This is another way that tuning of first spring K2$a$ may be used to shape the output of AVA 18$a$. Furthermore, it may be equally desirable to tune the resonances of the flexibly mounted AVA 18a by adjusting the first free-floating mass M2a, second free-floating mass M3a, and/or the springs K2a and K3a, such that the first resonance substantially coincides with the 4 per rev disturbance frequency and such that the second resonance substantially coincides with the 8 per rev disturbance frequency. The 4 per rev and 8 per rev disturbance frequencies may result from a fundamental rotational disturbance frequency and a harmonic thereof as produced in a 4-bladed turbo-prop aircraft.

Figure 3A:
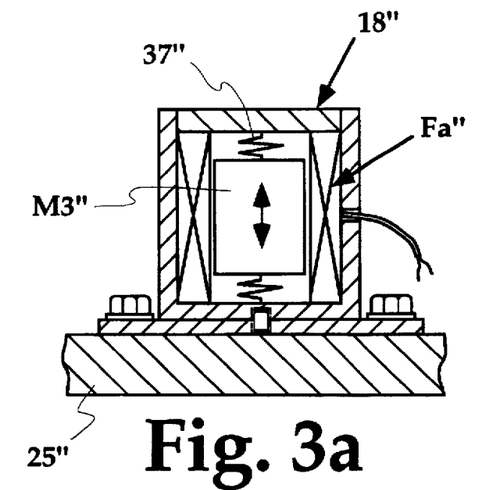
FIG. 3a is a cross-sectional side view of a schematic depiction of an embodiment of an active vibration absorber suitable for use with the present invention.
Figure 3B:
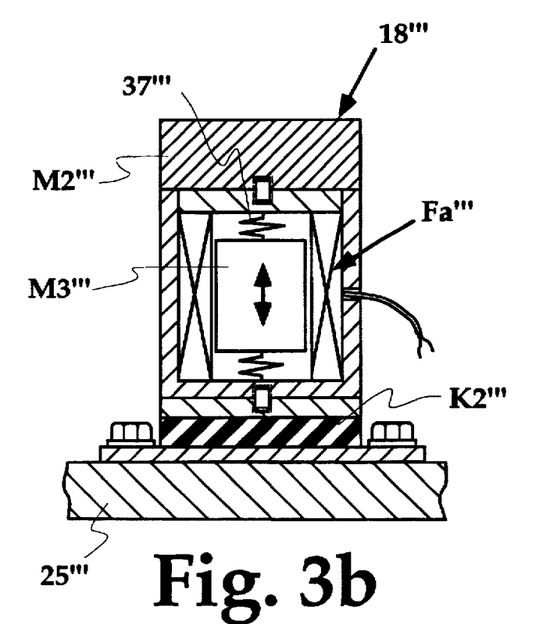
FIG. 3b is a cross-sectional side view of a schematic depiction of an embodiment of an active vibration absorber suitable for use with the present invention.

Shown in FIG. 3a and FIG. 3b are other embodiments of Active Vibration Absorbers (AVAs) 18", 18'" which both include masses m3", m3'", spring elements 37", 37'" and force generators Fa", Fa'". The force actuators Fa", Fa'" are comprised of magnet and coil assemblies and provide the active forces to drive the absorber masses. Although shown as AVAs with single magnets and coils, other arrangements are possible, such as multiple magnet and coil arrangements taught in U.S. Pat. No. 5,231,336 to van Namen entitled "Actuator for Active Vibration Control." The AVA shown in FIG. 3a illustrates a Single Degree of Freedom (SDOF) AVA while the FIG. 3b embodiment illustrates a Multiple Degree of Freedom (MDOF) AVA. In the MDOF embodiment, additional mass M2'" and spring K2'" account for the additional degrees of freedom. In each case, the force generators Fa", Fa'" actively drive an absorber mass to generate vibration at the point of attachment of the AVA. Although, the AVAs are illustrated attached to the inner member 25", 25'" of an engine mounting, it should be understood that the AVAs described herein may be attached to any structural component within the system. Examples include attachment to the engine, engine pylon, or fuselage wall in aircraft applications and to a vehicle engine, frame, or body in automobile applications.

The active system illustrated in FIG. 4 also includes controller 21a, preferably including a CPU and memory, for sending a control signal through conduit 38a to actively activate actuator Fa. Activating actuator Fa will, in turn, drive second free-floating mass M3a relative to first free-floating mass M2a. Sensor 20a delivers a signal through cable 33a which is indicative of the vibration at the attachment point of AVA 18a to member 25. Further, sensors 15a, 20a' as illustrated may be located at some other remote point which is dynamically connected to the attachment point and where vibration is desired to be controlled. An algorithm may be used, such as Least Mean Square (LMS) to control the vibration at that local point or at a remote location. Furthermore, error sensor 20a' may be used to derive a signal indicative of the residual noise in passenger compartment 13.

A reference signal indicative of the frequency and phase of the disturbance is usually required for most control methods. A control method such as LMS may be used for both noise or vibration control. A simple closed loop control, if desired, may be used for cost-driven vibration control applications. For systems where the AVA 18a is flexibly mounted to the perimeter 12 of the closed volume 13, such as when attached to stiffening members of the aircraft fuselage 12, it may be desired to reduce noise in the cabin caused by vibration of the perimeter 12 of the closed volume 13. The term stiffening members includes ribs, stringers, frames and the like. Sensor 15a may then be used as a reference sensor in a feed forward system to derive a signal indicative of the vibration disturbance to be used as an input signal or an error signal, depending on what is to be controlled.

Figure 5:
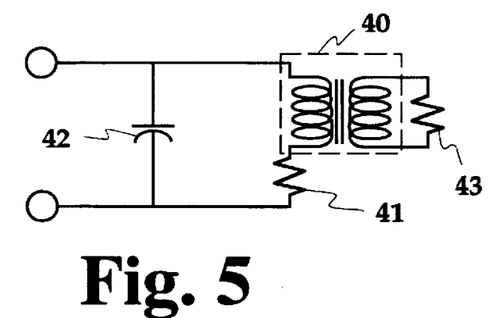
FIG. 5 is an equivalent circuit diagram of an active vibration control actuator suitable for use with an embodiment of the present invention.

The equivalent circuit of actuators 18, 18' for a solid iron core actuator is illustrated in FIG. 5 for high frequency operations. Actuators 18, 18' include inductor 40 and resistor 41 and capacitive element 42 at all frequency ranges of operation. In addition, at high frequencies, the actuator equivalent circuit includes an inductance 40 which is also a transformer to a lossy load 43. This load represents iron core loss.

Parallel capacitance 42 represents the interwinding capacitance and works with inductor 40 to produce a resonance at $1/(2\pi\sqrt{LC})$ which may be in the range of 1 MHZ. In-series resistance 41 is the "dc" resistance of the actuator coil. Each resistive component adds to power dissipation in actuator 18, 18'. Each conduction path adds to power dissipation in the driver amplifier (not shown in FIG. 3).

It is the inventor's belief that each of these dissipative components 41, 43 and the parallel capacitance 42 lowers the value of coil inductance 40, thereby undesirably lowering the L/R ratio at high frequencies. The lowering of the L/R ratio at higher frequencies allows parasitic currents which contribute to heat rise in actuator 18, 18' and the actuator driver (not shown in FIG. 3) which reduce the useable power available for the desired low frequency range currents. One of the beneficial aspects of the present invention is the reduction of the high frequency parasitic currents by providing for a desired higher L/R ratio up to higher frequencies. The system of the present invention accomplishes this objective without causing additional energy loss in the driver amplifier. Parasitic high frequency energy currents do not produce useable force from actuator 18, 18' and thereby only increase power dissipation and increase the operating temperature of both actuator 18, 18' and the driver amplifier (not shown in FIG. 3). This increase in temperature reduces the power available for the desired low frequency force signals to control vibrational energy in passenger compartment 13.

Figure 6:
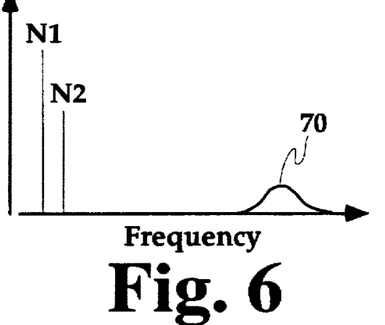
FIG. 6 is a graph of amplitude versus frequency illustrating vibrational energy components in a first frequency range to be controlled and in a higher, second switching frequency range.

Referring now to FIG. 6, a graph of signal strength versus frequency is illustrated. As shown in FIG. 6, vibrational energy sources (engines) 16, 16' produce vibrational energy is a first frequency range encompassing frequencies N1 and N2. More particularly, in the case of an aircraft, frequencies N1 and N2 may be in the low range of about 50–500 Hz corresponding to turbine speeds. As will be discussed further herein, FIG. 6 also illustrates the output signal from driver/controller 21 to actuators 18, 18' which is desirable for cancellation of vibrational energy generated by engine 16, 16'.

Figure 7:
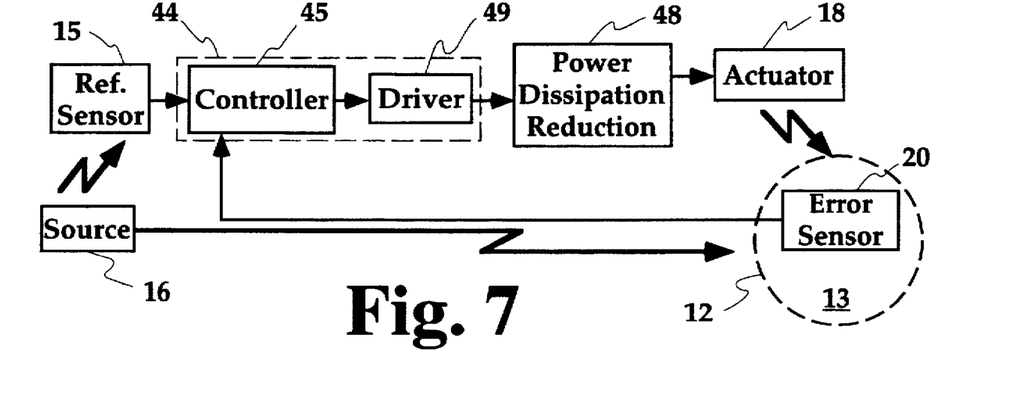
FIG. 7 is a block diagram illustrating an embodiment of the vibrational energy control system of the present invention.

Referring now to FIG. 7, a block diagram of the vibrational energy control system of the present invention is provided. Vibrational energy from vibrational energy source 16, 16' is detected by sensors 15, 20. The signal corresponding to the vibrational energy detected is provided by sensor 15, 20 to vibrational energy control circuit 44. Vibrational energy control circuit 44 is responsive to sensors 15, 20 for providing a drive signal which contains high frequency energy transients at frequencies outside the first frequency range of the vibrational energy to be controlled and at least one frequency component in the first frequency range (such as at N1 or N2, as illustrated at FIG. 6). Vibrational energy control circuit 44 includes controller circuit 45 and driver 49. Vibrational energy control circuit 44 generates current, substantially all of which is provided to actuator 18 as will be understood more particularly from the discussion of FIG. 9 below. Vibrational energy control circuit 44, or other control means, generates a pulse-width modulation driven signal responsive to sensors 15, 20 at a second, switching frequency above the frequency range of the vibrational energy to be controlled.

Figure 8:
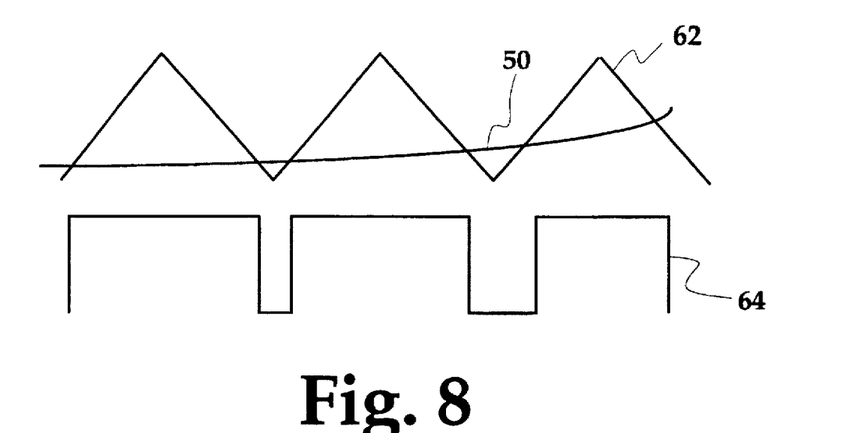
FIG. 8 is a graphical representation of the operation of an embodiment of the pulse-width modulation circuit suitable for use with the present invention.
Figure 8A:
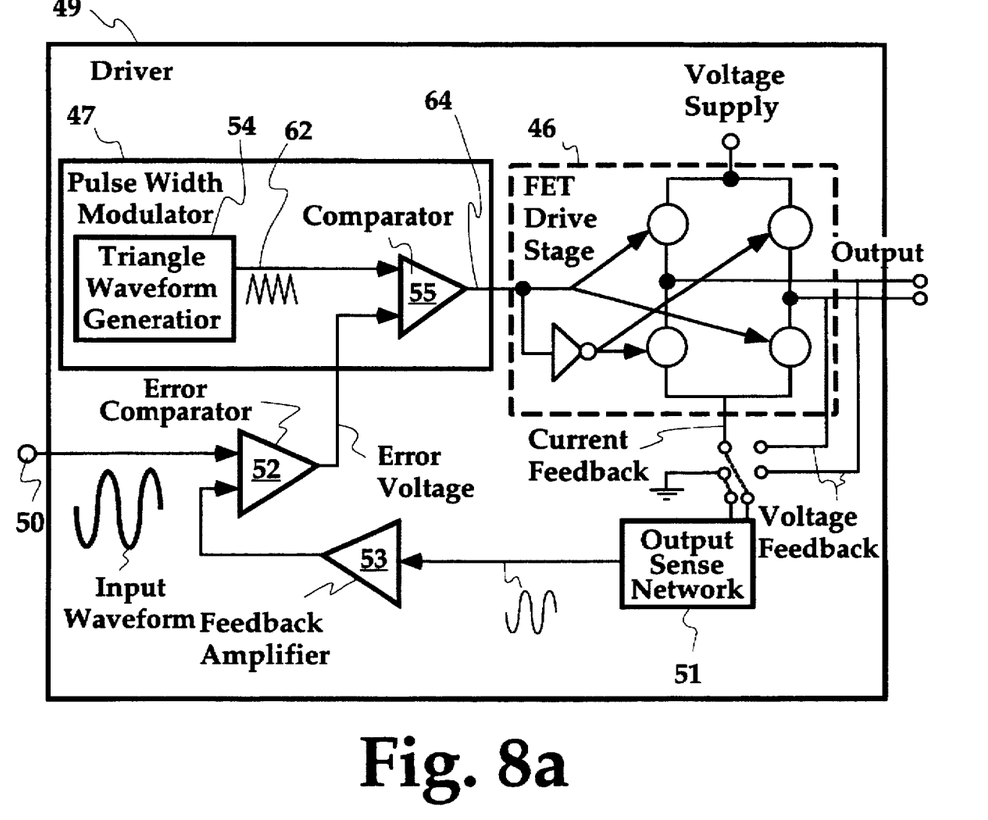
FIG. 8a is a circuit diagram of the pulse-width modulation circuit of FIG. 8.

The operation of an embodiment of driver 49 including pulse-width modulator circuit 47 and FET driver circuit 46 is illustrated in FIG. 8 and FIG. 8a. Vibrational energy (control) signal 50 is provided to one input terminal of error comparator 52. The other input to error comparator 52 is from output sense network 51 through feedback amplifier 53. The triangle wave output 62 of triangle wave generating circuit 54 is provided to an input terminal of comparator 55 as is the output of error comparator 52. Pulse-width modulated signal 64 is thereby generated at the output of comparator 55 responsive to vibrational energy signal 50 and feedback from output sense network 51. Pulse-width modulated output 64 is provided as an input to FET driver circuit 46 to provide a Class-D amplifier. A model HIP4081 chip from Harris Semiconductor, which is further described in an application note No. AN9325 which is available from Harris Corporation, may be used to provide pulse-width modulator circuit 47 suitable to the present invention.

Figure 9:
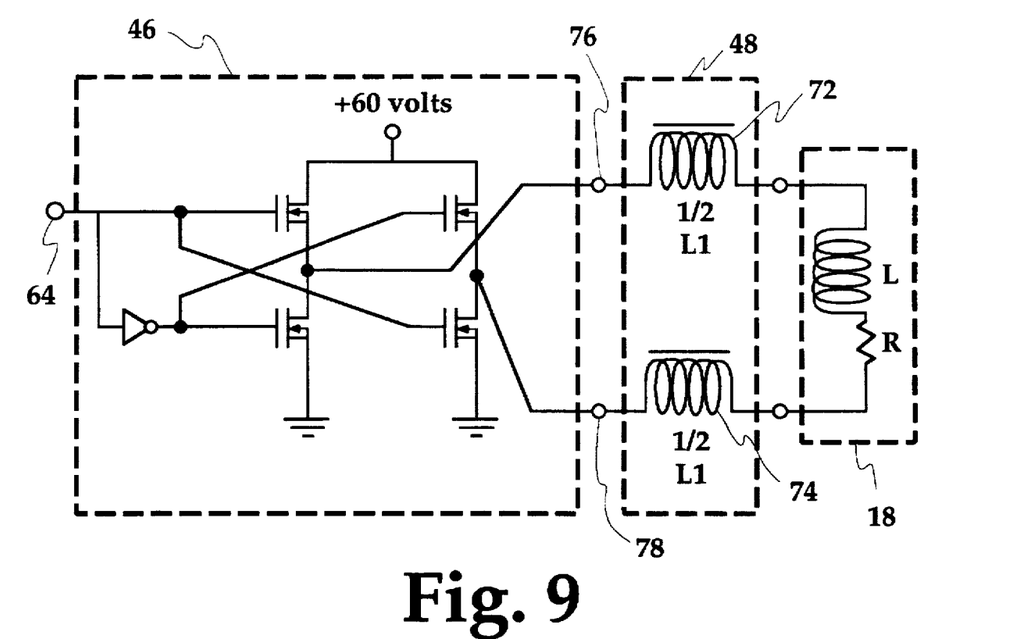
FIG. 9 is a circuit diagram of a driver circuit and power dissipation reduction circuit connected to an actuator for an embodiment of the present invention.

An embodiment of FET driver circuit 46 or other drive means (such as a half bridge) for generating a switching electrical output signal which can contains high frequency energy transients at frequencies outside the first frequency range of the vibrational energy to be controlled is illustrated in FIG. 9 connected to an equivalent circuit representation of actuator 18 through power dissipation reduction circuit 48. FET driver circuit 46 within driver 49 (FIG. 7) generates alternating current and substantially all of the alternating current from FET driver circuit 46 is provided to actuator 18 as is to be understood from FIG. 9. Class-D power amplifiers (drivers) 49 suitable for use with the present invention are as shown in FIG. 8a.

Driver 49 is electrically connected to controller circuit 45 (FIG. 7) and is responsive to control signal 50 from controller circuit 45. The pulse-width of the pulse-width modulated signal within driver 49 is varied by driver 49 responsive to control signal 50 from controller circuit 45 to provide in the switching electrical output signal of FET driver circuit 46 at least one frequency component in the frequency range of the vibrational energy to be controlled (as illustrated by N1 and N2 in FIG. 6). Actuator 18 is electrically connected to driver 49 and responsive to the at least one frequency component in the first frequency range of the vibrational energy to be controlled of the switching electrical output signal from driver 49.

Driver 49 applies full voltage to attached loads at all times and changes the polarity rapidly to produce an average value of the desired voltage across the load. Force is produced from load actuator 18 when current flows through a wire coil surrounding an iron-core. When using an iron-core, the iron at low frequencies (such as fifty to several hundred Hertz) has a long time constant produced by the inductance to resistance ratio (L/R) of the wire core making up the electromagnetic circuit. When low frequency currents are applied to actuator 18 force is proportional to the applied current. Because driver 49 produces these low frequency currents by switching the voltage rapidly from full positive to full negative at the rate of 30 kHz to 250 kHz, and preferably at least about 50 kHz, the fast switching transients produce eddy currents in the iron core of actuator 18 at the switching frequency and/or harmonics thereof which lowers the inductance and increases the resistance of the load. This reduction in the L/R time constant allows current to ramp up quickly at each transition producing an "ac" transient current which can have a large rms average. However, this high frequency "ac" transient current provides no benefits in control of the vibrational energy sources at the lower frequency range of N1 and N2.

Figure 10:
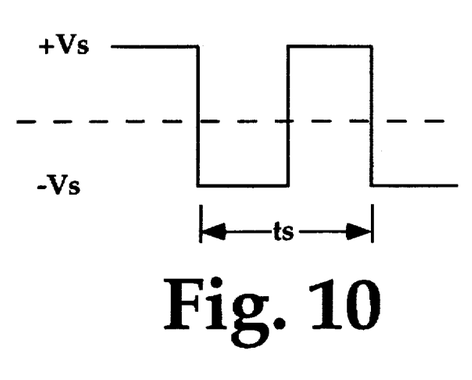
FIG. 10 is a graphical representation of the voltage output of a Class-D amplifier suitable for use with the present invention.
Figure 10A:
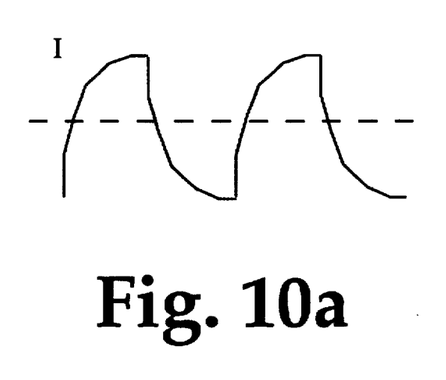
FIG. 10a is a graphical representation of the current output of the Class-D power amplifier of FIG. 10.

Referring now to FIGS. 10 and 10a, the output of FET driver circuit 46 connected to actuator 18 is illustrated. FIG. 10 illustrates the voltage output of FET driver circuit 46 and also of driver 49. As illustrated in FIG. 10, switching frequency time period $t_s$ is a constant. For example, if a switching frequency of 125 kHz is selected, $t_s$ will be 8 microseconds. As illustrated in FIG. 10, a pulse-width of 50% is shown.

The corresponding current wave form for FET driver circuit 46 connected to actuator 18 is illustrated in FIG. 10a. As would be understood by one of ordinary skill in the art, the inductive and resistive elements of the load circuit provide a time constant for the exponential current function which corresponds to the ratio L/R. For example, for an actuator 18 having an inductance/resistance ratio of 6 mH/1 ohm at low frequencies the circuit time constant would be 0.006 seconds.

Referring again to FIG. 6, the parasitic affect of the switching amplifier spectral energy in the switching frequency range, centered typically around 50 kHz to 250 kHz is illustrated at 70. High frequency energy transients 70 fall within the range of frequencies affected by iron-core losses and interwinding capacitance. The present invention affects the amplitude of high frequency energy transients 70 as will be described below.

Referring again to FIG. 9, the system of the present invention also includes actuator power dissipation reduction circuit 48, or other actuator power dissipation reduction means electrically connected between FET driver circuit 46 and actuator 18 for reducing the amplitude of high frequency energy transients 70 in the switching electrical output signal of FET driver circuit 46 to reduce power dissipation in actuator 18 from high frequency energy transients 70. Actuator power dissipation reduction circuit 48 preferentially reduces the amplitude of high frequency energy transients 70 in the drive signal from vibrational energy control circuit 44 to reduce power dissipation in actuator 18 from high frequency energy transients 70. Actuator power dissipation reduction circuit 48 preferably includes in-series inductor 72, 74. Inductors 72, 74 are inserted between actuator 18 and the respective first and second output poles of FET driver circuit 46 as illustrated at output poles 76, 78 of FET driver circuit 46. As is also illustrated in FIG. 9, the output from FET driver circuit 46 is provided between output poles 76, 78. Each of in-series inductors 72 and 74 is associated with a respective output pole 76, 78 of FET driver circuit 46 and serially electrically connects respective output poles to respective ends of actuator 18, 18'.

In-series inductors 72, 74 maintain a high L/R ratio at the switching frequencies of driver circuit 46 to thereby reduce high frequency rms currents. In-series inductors 72, 74 also reduce the effect of interwinding capacitance 47 (see FIG. 5) by maintaining an inductance to the actuator load at the LC resonant frequency of the actuator load. Inductors 72, 74 are selected of a type that maintains its inductance at high frequency, preferably powdered-iron or ferrite core-type inductors. An appropriate inductor to use for series inductors 72, 74 is an SRC1000 available from OPT Industries, Inc.

Class-D power amplifiers have been used to drive audio speakers. However, in speaker applications of Class-D audio amplifiers, the amplifiers typically contain a small inductor with a capacitor connected to ground to form a low pass filter so that only the low frequency components of the switching amplifier are directed to the speaker. While this is effective in reducing the power dissipation of the speaker, it provides an additional current flow (conduction) path which increases the power dissipation of the power amplifier by providing a conduction path for the high frequency energy through the filter. While such an approach is useful in the context of audio speakers, the additional power dissipation and resulting heat generation is undesirable in the case of vibrational control systems as in the present invention. First, actuator 18 is a mechanical force type actuator which is more subject to eddy current losses at high frequencies than is the case with speaker coils. In addition, for vibrational control systems on vehicles, as with the present invention, loss of energy in the power amplifier causes undesirable energy use and heat generation in the constrained environment of vehicle design. The novel approach of the present invention, as illustrated in FIG. 9, provides for a reduction of power dissipation in both FET driver circuit 46 within driver 46 (FIG. 7) and in actuator 18.

Figure 11:
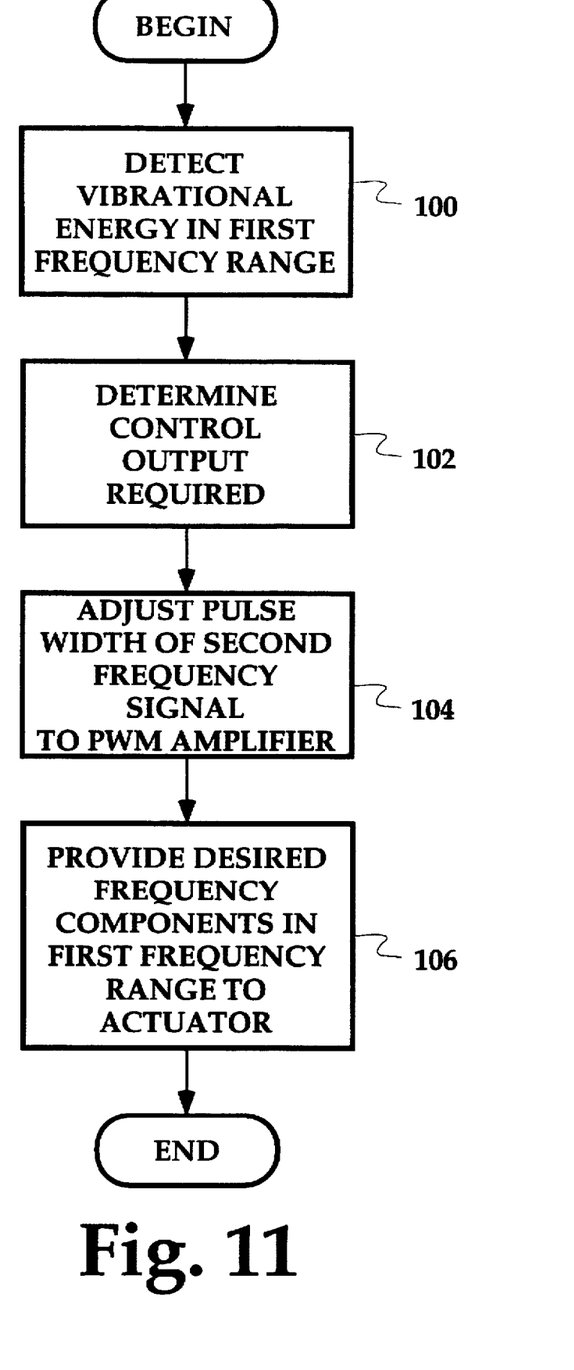
FIG. 11 is a flowchart illustrating operation of an embodiment of the vibrational energy control system of the present invention.

The operations of an embodiment of the system of the present invention will now be discussed with reference to the flow chart of FIG. 11. At block 100, sensor 15, 20 detects vibrational energy in a first frequency range which is to be controlled. At block 102, known control algorithms are applied to determine the desired output required. While the particulars of the control output logic will not be discussed herein, discussion of alternative control logic suitable for use with the present invention are included in various of the patent references cited previously and incorporated herein by reference.

At block 104, the pulse-width of the signal to FET driver circuit 46 is adjusted by pulse width modulator circuit 47 responsive to controller circuit 45 as described previously with reference to FIGS. 8 and 8a. At block 106, FET driver circuit 46 provides an output signal through power dissipation reduction circuit 48 to actuator 18 containing the desired frequency components in the first frequency range. If changes are detected in the vibrational energy at block 100, the steps of block 102–106 are repeated to provide the desired output to actuator 18 (FIG. 1).

Figure 12:
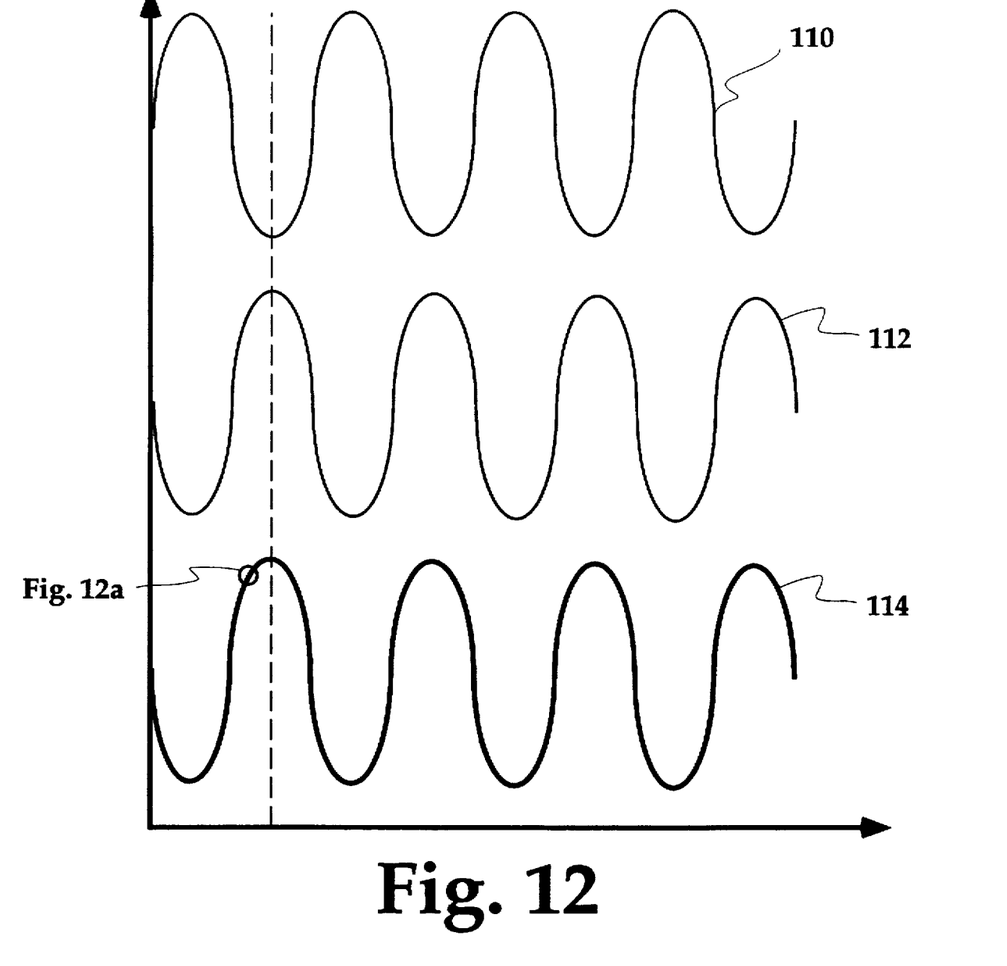
FIG. 12 is a graphical representation of operation of an embodiment of the vibrational energy circuit of the present invention.

The use of a Class-D amplifier at switching frequencies in the 30 kHz–150 kHz frequency range to provide frequency outputs in a lower first frequency range such as 50 to several hundred Hertz is illustrated by the example curves shown in FIG. 12. In the example of FIG. 12, a simplified model is assumed with the vibrational energy to be controlled having only a single frequency component with the control signal for the single actuator shown. The desired output signal to actuator 18 for control is at the frequency of the vibrational energy to be controlled but out of phase so as to provide a cancellation effect. The vibrational energy signal to be controlled is illustrated at 110 as a sine wave at a constant frequency. The desired cancellation output (control) signal 112 to driver 49 (FIG. 7) is illustrated as a phase shifted sine wave at the same frequency to cancel out the vibrational noise energy 110.

Figure 12A:
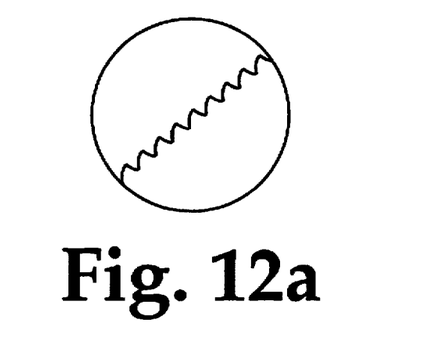
FIG. 12a is an exploded view of a portion of one of the curves from FIG. 12.

The output of FET driver circuit 46 operating at higher frequency switching frequencies is illustrated as curve 114 and in greater detail in FIG. 12a. As illustrated in FIG. 12a, a pulse-width of greater than 50% is applied which results in providing the rising slope desired for the illustrated blown-up portion of curve 114. For a decreasing curve portion, a pulse-width of less than 50% is provided with the slope of the curve being determined by the value of the pulse-width.

Figure 13:
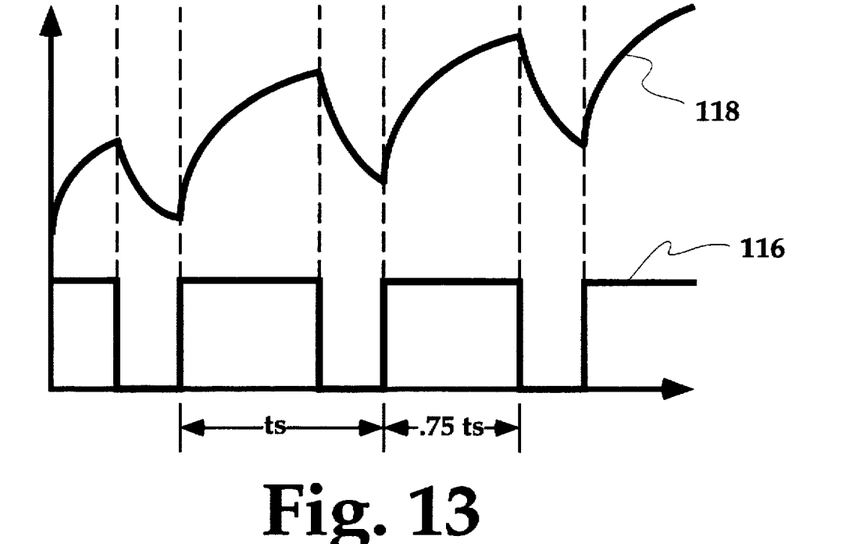
FIG. 13 and FIG. 13a are graphical illustrations of the operation of the vibrational energy circuit of an embodiment of the present invention.
Figure 13A:
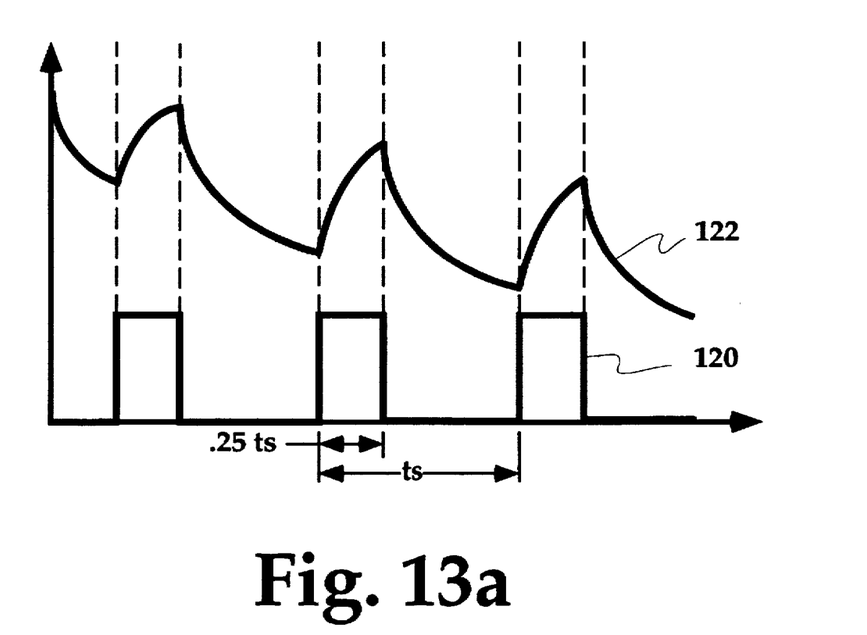

The pulse-width slope relationship is illustrated further in FIGS. 13 and 13a. As shown in FIG. 13, a pulse-width of 75% (0.75 t$_s$) is applied as illustrated at 116. The resulting output is illustrated at 118. Likewise, in FIG. 13a, a 25% (0.25 t$_s$) pulse-width is illustrated by the curve at 120 and the corresponding output is shown by the curve of 122.

The invention has been explained in general terms above. The following example is provided to further illustrate the invention.

EXAMPLE 1

Figure 14:
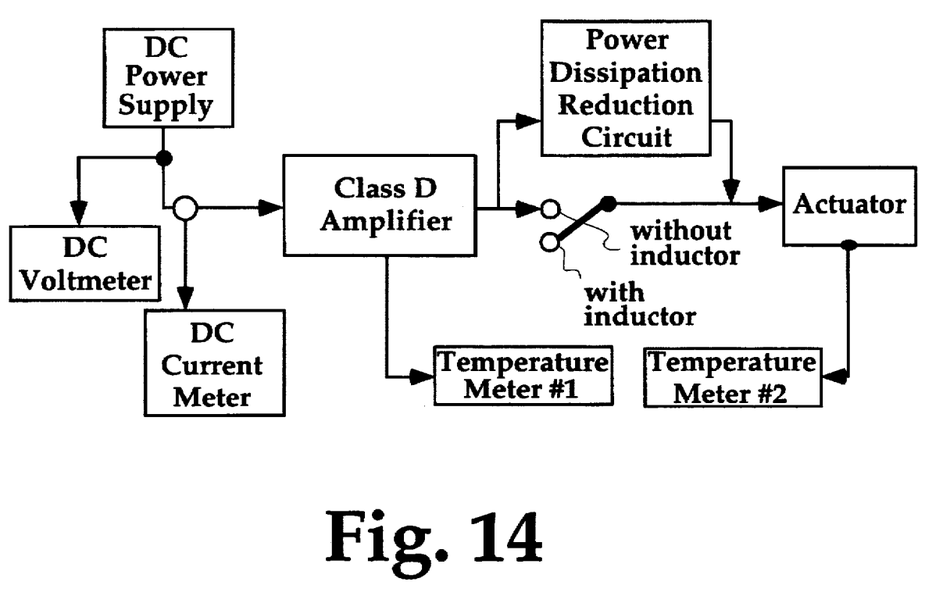
FIG. 14 is a block diagram illustrating a test embodiment of the actuator power reduction circuit of the present invention.

Components of the improved vibrational energy control systems of the present invention were tested using a test setup including a Class D amplifier, a driver circuit, a power dissipation reduction circuit (similar to FIG. 9) and a single degree of freedom AVA. Using a 1 mH inductor for inductors 72, 74, power consumption of 2.27 watts was measured. With an unmodified drive without the series 1 mH inductors, 9 watts of energy was measured. The 1 mH inductor used in the test was an OPT type, model SRC1000. The Class-D amplifier used for the test was as illustrated in FIG. 8a. The actuator used for the test was a single degree of freedom AVA. A block diagram for the test system is provided as FIG. 14.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A control system for controlling vibrational energy in a first frequency range to a vehicle from a vibrational energy source, comprising:

a) a sensor for monitoring said vibrational energy to be controlled;

b) a vibrational energy control circuit responsive to said sensor having a first output pole and a second output pole for providing a drive signal between said first output pole and said second output pole which contains high frequency energy transients at frequencies outside said first frequency range and at least one frequency component in said first frequency range;

c) an actuator electrically connected to said first output pole and said second output pole and responsive to said at least one frequency component in said first frequency range of said drive signal for generating forces to control said vibrational energy;

d) an actuator power dissipation reduction circuit electrically connected between said vibrational energy control circuit and said actuator for preferentially reducing an amplitude of said high frequency energy transients in said drive signal to reduce power dissipation in said actuator from said high frequency energy transients, said actuator power dissipation reduction circuit including a first inductor serially electrically connecting said first output pole to said actuator and a second inductor serially electrically connecting said second output pole to said active vibration control actuator; and wherein said vibrational energy control circuit generates current and substantially all of said current from said vibrational energy control circuit is provided to said actuator.

2. A control system as in claim 1 wherein said actuator comprises an active vibration control actuator.

3. A control system as in claim 2 wherein said active vibration control actuator includes an iron core.

4. A control system as in claim 3 wherein said vibrational energy control circuit includes a power-amplifier.

5. A control system as in claim 4 wherein said power-amplifier comprises a Class-D power amplifier.

6. A control system as in claim 4 wherein said power-amplifier comprises a pulse width modulated power amplifier.

7. A control system as in claim 6 wherein said pulse width modulated power amplifier generates alternating current and substantially all of said alternating current from said pulse width modulated power amplifier is provided to said active vibration control actuator.

\* \* \* \* \*